United States Patent
Rodseth et al.

(10) Patent No.: US 8,762,083 B2
(45) Date of Patent: Jun. 24, 2014

(54) INTELLIGENT FUSE HOLDER AND CIRCUIT PROTECTION METHODS

(75) Inventors: William G. Rodseth, Antioch, IL (US); Daniel Stanek, Lincolnshire, IL (US); Daniel Gilman, Chicago, IL (US)

(73) Assignee: Littelfuse, Inc., Chicago, IL (US)

( * ) Notice: Subject to any disclaimer, the term of this patent is extended or adjusted under 35 U.S.C. 154(b) by 1271 days.

(21) Appl. No.: 12/181,075

(22) Filed: Jul. 28, 2008

(65) Prior Publication Data

US 2010/0023286 A1 Jan. 28, 2010

(51) Int. Cl.
*G01R 25/00* (2006.01)

(52) U.S. Cl.
USPC .......................................................... 702/65

(58) Field of Classification Search
USPC .................... 702/65, 62, 34; 361/93.1; 417/18
See application file for complete search history.

(56) References Cited

U.S. PATENT DOCUMENTS

| | | | | |
|---|---|---|---|---|
| 5,425,623 | A * | 6/1995 | London et al. | 417/18 |
| 5,587,931 | A * | 12/1996 | Jones et al. | 702/34 |
| 2002/0075620 | A1* | 6/2002 | Fischer et al. | 361/93.9 |
| 2006/0087785 | A1* | 4/2006 | Bender et al. | 361/93.1 |
| 2006/0197383 | A1* | 9/2006 | Frey | 307/64 |
| 2007/0136010 | A1* | 6/2007 | Gunn et al. | 702/62 |
| 2008/0157776 | A1* | 7/2008 | Jaffer et al. | 324/424 |
| 2009/0132202 | A1* | 5/2009 | Walker et al. | 702/184 |

* cited by examiner

*Primary Examiner* — Tung S Lau
*Assistant Examiner* — Xiuquin Sun
(74) *Attorney, Agent, or Firm* — Kacvinsky Daisak Bluni PLLC

(57) ABSTRACT

An intelligent circuit protection system and method for automating component replacement and providing information to a user or operator about a load for circuit protection. The circuit protection method includes sensing current and voltage across a fuse protecting a load; sending at least one signal indicative of the current and voltage; and using the at least one signal to determine if the load is operating normally.

10 Claims, 10 Drawing Sheets

INTELLIGENT FUSE HOLDER AND CIRCUIT PROTECTION METHODS

BACKGROUND

The present disclosure relates to circuit protection and in particular to intelligent circuit protection systems and methods.

It is known to employ circuit protection in electrical systems. Fuses for example open when a short circuit occurs or in cases in which an overload occurs for an extended period of time. When such situations occur, the fuse opens, removes power from the load, protecting the load. While the load is protected, it is rendered inoperable until the opened fuse is replaced. The inoperability of the load can lead to costly downtime, especially if other electrical devices, e.g., in a manufacturing facility, depend on the inoperable load. Accordingly, it would be beneficial to know when a particular load is about to produce an overload or other event that would cause the load to open prior to, e.g., just prior to, the actual opening of the fuse, so that the load can be replaced at a convenient time, prior to fuse opening event, which in all likelihood will occur at an inopportune time, e.g., when a manufacturing facility is in full production.

Circuit protection devices, such as fuses, like most other devices can wear out over time. Thus a fuse may open when it has weakened, perhaps even in a normal load condition, absent a fuse opening event. Accordingly, it would be beneficial to know when a particular circuit protection device is close or is likely close to the end of its effective operating life, so that the circuit protection device can be replaced at a convenient time, prior to the failure of the circuit protection device, which again may occur at an inopportune time.

As discussed above, when a circuit protection device fails, it is in many cases due to an underlying problem with the load that the circuit protection device is protecting. Simply replacing the circuit protection device may not solve the underlying problem. To solve the underlying problem, it may be useful to know why or how the circuit protection device failed, e.g., due to an overload situation or due to an overcurrent situation. Accordingly, a need also exists to provide a circuit protection device with diagnostic capability.

SUMMARY

The present disclosure relates to intelligent circuit protection systems and methods that automate component replacement and provide information to the user or operator about the load that is useful for preventing a circuit protection device from opening or explaining why the device has opened.

In one embodiment, a solid state sensing circuit is shunted when a fuse is present. When the fuse opens, the solid state circuit is powered and provides a solid state switch output via optical coupling with the sense circuitry. When the fuse opens, the output device becomes biased to allow communication with an external device, e.g., an external controller or programmable logic controller ("PLC"). This arrangement prevents the system from false triggering upon a power failure. When the fuse is replaced, the sensing circuit is reset automatically.

In another embodiment, an intelligent circuit protection system is provided, which monitors many different loads, such as all loads occurring within a machine of a manufacturing assembly line. The system can be expanded to monitor all electrical loads with an entire assembly line of a factory, or even multiple assembly lines within a factory or manufacturing setting. The system is also expandable, so that the intelligent monitoring can be increased over time. It is contemplated that the monitoring be done on the floor at the machine or assembly line, at a remote facility within the manufacturing facility or at a remote site away from the manufacturing facility. For example, the information that the smart system generates can be uploaded to an intranet or internet, which allows operators virtually anywhere in the world to monitor the circuit protection data.

The intelligent monitoring system of the present disclosure is modular. Multiple sensing circuits area daisy-chained to a processing unit. The individual circuits of the chain can monitor various aspects of a single load or can be dedicated to different loads. For example, three circuits can be dedicated each to a different phase change of a three-phase load, e.g., a motor, or each of the circuits can be dedicated to a different load, e.g., three different single phase motors of a machine or assembly line. In one embodiment, the sensing circuit, no matter how it is applied, has the capability to monitor device current, supply voltage and terminal temperature. This information is fed into a processing and memory portion of the system, which is programmed to use such information to perform many different calculations to determine, for example, if a problem is occurring or about to occur with the load or to determine if a problem is occurring or is about to occur with the circuit protection device.

To daisy chain the loads, each sensing circuit within a group of sensing circuits is provided a specific address. Each group of sensing circuits has at least one control unit including processing and memory. Each control unit in turn can have a specific address. Different groups of sensing circuits are differentiated by the specific address of the respective control units. Communication between processors can be wired or via wireless technology. For example, it is contemplated to transmit data via Ethernet or radio frequency ("RF") link, e.g., via a Bluetooth™, WiFi™, Zigbee™ or other open and proprietary protocol. It is also contemplated to tie different processors through a common bus.

The monitoring of voltage, current and temperature allows the system to detect hot spots within a circuit protection panel, for example, without the need for an operator to physically open the panel and use a thermal imaging device as is done currently. When the panel has to be opened, the risk of personal injury, e.g., from an arc flash, increases. Because the system allows the hot spot monitoring to be performed remotely, safety and efficiency (monitoring can be performed continuously versus at certain intervals associated with manual hand held device monitoring) are improved. Monitoring temperature also allows the loosening of an electrical connection to a fuse holder, which typically causes a temperature rise to be detected. The circuit system of the present disclosure not only can detect a loose connection but also pinpoint where the loose connection is located.

The multiple sensing of the circuitry also allows the system to monitor phase. For example, a three-phase device, such as a three-phase motor, can continue to operate even with the loss of one phase of its input power. However, it is not wise to allow such operation to occur because the faulty operation can lead to further damage of the equipment. The present system monitors each phase of the input power to look for a loss of power. If a loss of power is detected on any phase, the circuitry powers the remaining phases down automatically, e.g., via a shunt trip disconnect switch, and alerts the appropriate operators.

The processor operating the circuit protection system monitors the phase and power factor of a particular load and provides an alert or an alarm if the phase or power factor surpasses and allowed level. The processor can be connected to a local data sharing network, a wide area network ("WAN"), internet or other network, which can deliver the alert to a remote location, which can then take appropriate action. Certain energy providers provide discounts if equipment power factors are maintained below certain levels. The monitored data can also be used to show to the energy providers that energy is being used efficiently, which verifies that a reduced energy rate is appropriate.

The multiple parameter sensing of the load and circuit protection device allows various power consumption characteristics of the load, such as operating curves that are generated for startup of a load and normal operation of the load to be monitored and recorded. Here again, when these curves fall outside of an expected characterization, the system provides an alert as discussed above.

The system can also include counting and timing circuits, which can count a number of times that a certain load is energized, know the age of the load and/or the fuse and perform calculations using this information. Such counting and timing in combination with the monitoring of current, voltage and temperature allows the system to determine if one or both of the load and the circuit protection device is in need of replacement. Such determination is made before a catastrophic event occurs, leading to costly downtime.

It is also contemplated to link the system to pagers or cell phones of maintenance personnel at a facility, and/or to an audible and/or visual alarm within the facility. The maintenance personnel can upload information from the system using an infrared data association ("IRDA") or handheld device, such as a personnel digital assistant ("PDA"), to provide onsite information to the maintenance personnel. The information can be uploaded before the operator opens a panel, making the operator better prepared for a dangerous condition when the panel is opened. It is further contemplated to link the sensing system to output devices, such as a disconnect circuit or shunt disconnect switch that removes power to the load to safely prevent catastrophic system failure and possibly personal injury.

Still further, it is contemplated to provide the circuit protection device with an identifier or tag that the sensing circuitry reads to ensure that a properly rated circuit protection device or fuse is being installed. For example, the circuit protection device can have a radio frequency identifier ("RFID"). The sensing circuitry has a corresponding RFID reader. The reader is positioned such that when the circuit protection device or fuse is installed, the RFID tag on the circuit protection device is within range of the reader. The reader reads information provided by the tag, such as the rating and type of fuse to ensure that the fuse is proper for the particular application.

Moreover, it is further contemplated to provide impedance or other type of monitoring to monitor real time performance of the fuse including a large impedance change of the fuse after it has opened. By recording an analyzing startup and opening load characteristics over time the processing can monitor trends that indicate abnormal behavior that needs to be investigated prior to costly system failure. It is contemplated to count startup and current spike events as well as $i^2T$ values. The system uses this information to determine if it is time to replace an aging circuit protection device or load. Further, the processing can determine $i^2T$ that it is time to test a particular circuit protection device.

Accordingly, in one embodiment an apparatus and method for circuit protection is provided which includes sensing current and voltage across a fuse protecting a load and sending at least one signal indicative of the current and voltage to a processor programmed to use the signal to determine if the load is operating normally. Sensing the current and voltage can be during a start-up of the load or after start-up of the load.

In another embodiment, an apparatus and method for circuit protection is provided which includes sensing current and voltage across a fuse protecting a load and sending at least one signal indicative of the current and voltage to a processor programmed to use the information to determine if the load should be replaced. The processor can be programmed to count power spikes indicated by the at least one signal and determining that the load should be changed after counting a designated number of power spikes.

The apparatus in one embodiment is a fuse holder having circuitry that allows the condition of the fuse to be monitored and/or provides information when a fuse opens. In one embodiment, the circuitry is configured to be able to operate on the leakage current that flows through the circuitry after the fuse has opened. Leakage current is standardized to be maintained below a certain amount, e.g., at or below five mA for most load applications. The resistance and impedance of the circuitry is configured to regulate the leakage current to be below the standardized valve. The sensing and outputting of the circuitry is configured to run on the low current, e.g., on five mA or less. In this manner, the intelligent fuse holder circuitry does not require external power.

In a further embodiment, an apparatus and method for circuit protection is provided which includes programming the processor to determine that the load should be changed if a start-up power draw determined using the at least one signal surpasses a designated start-up value. The processor can be programmed to determine that the load should be changed if a normal operation power draw determined using the at least one signal surpasses a designated normal power drain value. The processor can also be programmed to determine that the load should be changed if a power factor for the load determined using the at least one signal surpasses a designated power factor value. It is contemplated that the user can receive a discounted energy price by replacing loads that consume too much energy.

In still another embodiment, an apparatus and method for circuit protection is provided which includes sensing current and a temperature indicating value across a fuse and sending at least one signal indicative of the current and the temperature-indicating value to a processor programmed to use the at least one signal to determine if the fuse should be replaced before the fuse fails. The processor can be programmed to calculate an $i^2T$ value from the at least one signal and compare the calculated $i^2T$ value to an expected $i^2T$ value.

In still a further embodiment, an apparatus and method for circuit protection is provided which includes configuring circuitry in a fuse holder to sense a temperature-indicating value across a fuse of the fuse holder, sending the temperature-indicating value to a processor, and programming the processor to use the value to detect a loose connection to the fuse holder. The processor can be programmed to convert the value to a temperature and compare the temperature to an expected temperature.

In yet another embodiment, an apparatus and method for circuit protection is provided which includes programming a processor to (i) calculate an impedance of a fuse using at least one signal indicative of a voltage and current sensed across the fuse and (ii) determine from the calculated impedance if a rating of the fuse is proper for a given load. The processor can be programmed to compare the calculated impedance to an expected impedance for a properly labeled fuse.

In another aspect of the present disclosure, the system provides diagnostic information to the operator after a fuse opening or other type of overload or overcurrent event occurs.

In the example discussed below, a landscaping electrical system is shown. The landscaping system uses fuses, which in the example illustrated are blade type fuses used elsewhere in automotive systems. The fuses are wired or placed in electrical communication with sensing circuitry, which detects the type of electrical condition that occurs to open the fuse. The circuitry is connected to output devices, such as lights or light emitting diodes ("LED's").

In one embodiment, a different light or LED is provided for each potential type of failure. For example, the blade fuse can open do to an overcurrent (short circuit) event or overload (lower voltage overcurrent event that occurs over a longer period of time). If an overcurrent occurs, the sensing circuitry detects such event and illuminates the overcurrent LED. Likewise, if an overload condition occurs, the diagnostic circuitry detects such event and illuminates the overload LED. The operator can thereafter view an LED panel associated with the fuses to determine what type of the event has led to the opening of the fuse. Knowing such information aids the operator in diagnosing the circuit to prevent the same event from occurring again.

In another embodiment, a single LED is provided for each fuse. Here, the system can indicate a short circuit fault by lighting the LED constantly and an overload fault by lighting the LED intermittently.

It is accordingly an advantage of the present disclosure to add intelligent monitoring, failure prevention, safety enhancement, and proactive outputting capabilities to a circuit protection system.

It is another advantages of the present disclosure to provide a modular circuit monitoring system.

It is a further advantage of the present disclosure to monitor and analyze startup, operating load characteristics, spike current event and $i^2T$ characteristics of a load.

It is yet another advantage of the present disclosure to provide diagnostic capabilities to circuit protection systems.

It is yet a further advantage of the present disclosure to remotely monitor an electrical system.

It is yet another advantage of the present disclosure to enhance the safety of electrical systems.

It is still a further advantage of the present disclosure to predict failure in either the load or circuit protection device prior to a catastrophic event.

Still further, it is an advantage of the present disclosure to provide a system that alerts technicians or maintenance personnel to a circuit protection event and provides information to the operator, which is useful to know prior to the operator physically manipulating the load or circuit protection device.

Moreover, it is an advantage of the present disclosure to provide a system that can pinpoint a problem component in a problem electrical panel from numerous panels scattered throughout a manufacturing complex, facilitating quick response and minimal downtime.

Additional features and advantages are described herein, and will be apparent from, the following Detailed Description and the figures.

DETAILED DESCRIPTION

Circuit Protection Monitoring System having Alarm Capability

Figure 1:
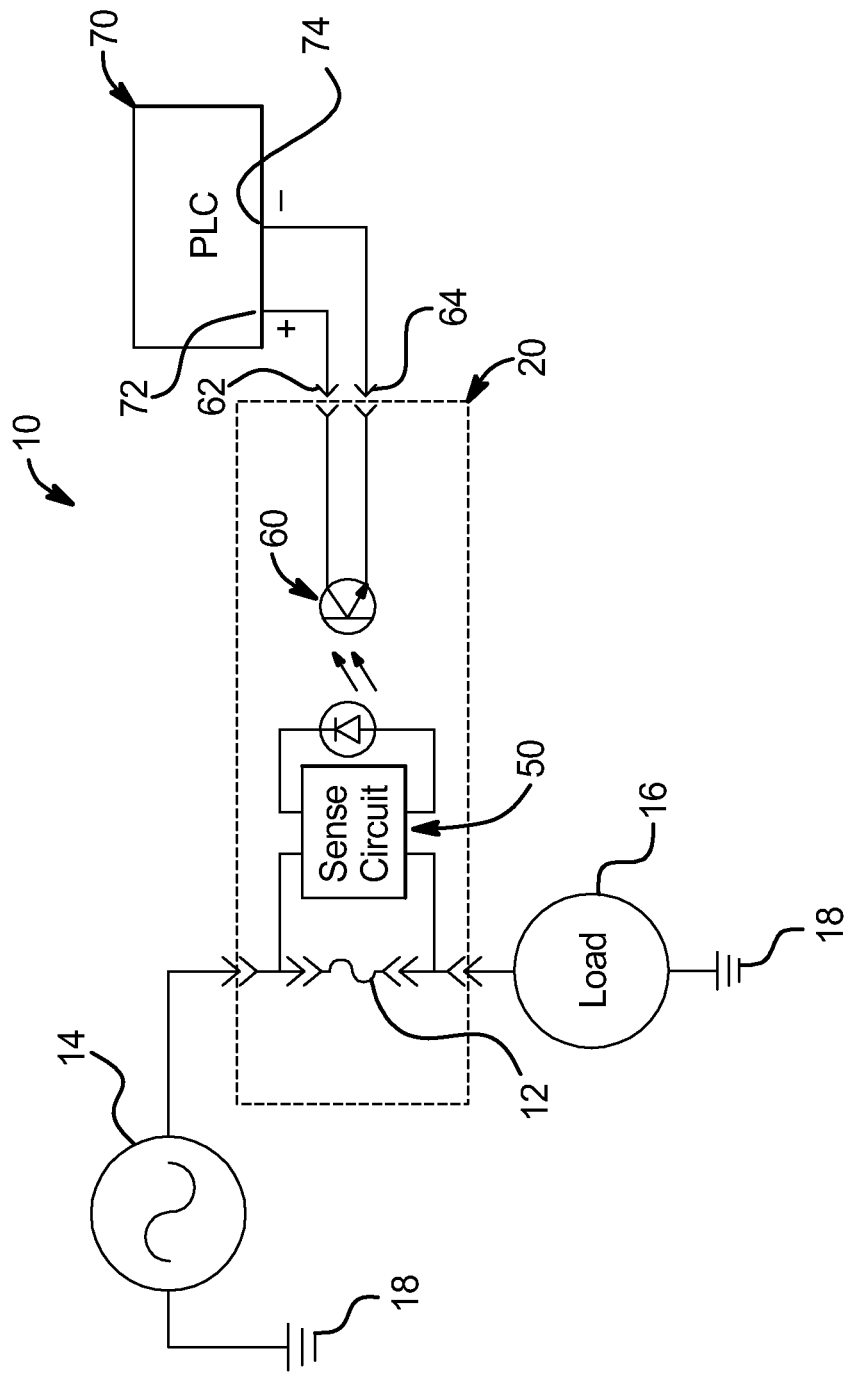
FIG. 1 is a schematic illustrating one example of a single sense circuit system of the present disclosure.

Referring now to the drawings and in particular to FIG. 1, system 10 illustrates one embodiment of a circuit protection system for a single load and single circuit protection device. Circuit protection device 12 is shown herein as being a fuse, however, circuit protection device 12 can have other forms, such as being an over-voltage protection device, an over-temperature protection device or a circuit breaker. Fuse 12 is placed between a power supply 14 and a load 16. Power supply 14 and load 16 are both referenced to ground 18, which can be the same or a different ground. Power supply 14 can be an alternating current or direct current power supply operating at a voltage of anywhere between 24 and 600 VAC or VDC.

Load 16 can be any type of load suitable for operation with the above-listed range for power supply 14. FIG. 3 below shows one embodiment of a solid state sensing fuse holder 20, which is shown schematically in system 10 of FIG. 1 via the dotted outline. System 10 and fuse holder 20 operate with fuse 12 and a sensing circuit 50. One example of sensing circuit 50 is shown in connection with FIG. 2. Sensing circuit 50 is wired in parallel with circuit protection device or fuse 12. Sensing circuit 50 in system 10 outputs to an optically isolated output 60, having output contacts 62 and 64. System 10 shows one example of an output device 70, which is a programmable logic controller ("PLC") 70. PLC 70 includes contacts 72 and 74 which form a circuit with contacts 62 and 64 of optically isolated output 60 of fuse holder 20 of system 10.

In the embodiment illustrated in FIG. 1, output 60 of fuse holder 20 sends a discrete output to PLC 70. PLC 70 is programmed to use the discrete input from fuse holder 20 in a desired manner. For example, if sensing circuitry 50 is configured to monitor current across fuse 12 and output when the current rises above a particular limit, optically isolated output 60 is thereby configured to send an output indicative of such a condition to PLC 70, which in turn is programmed to perform a desired function, such as trip a disconnect at the load, alert an operator, or increment a counter. In another example, sensing circuitry 50 can be configured to monitor each time load 16 is started, so that PLC 70 or other processing can keep track of how many times fuse 12 is subjected to the startup power that load 16 draws. If a limit for fuse 12 is set at X number of loads startups, PLC 70 can monitor this number and alert an operator when the limit has been reached or is about to be reached.

In another example, the sensing circuitry 50 senses the peak current data load 16 draws over a particular span of operation. Sensing circuitry 50 outputs via output 60 the peak current level to PLC 70. PLC 70 or other processing device compares the peak current to an expected peak current. If the expected peak current surpasses a threshold, the system operator is alerted.

Sensing circuitry 50 and PLC 70 can be configured to perform any one or more of: (i) monitor a start-up of the load to look for a non-characteristic power draw as compared to a known start-up curve for the load; (ii) monitor the load under normal operation to look for a non-characteristic power draw as compared to a known power draw for the load during normal operation; (iii) monitor a temperature of a connection of the load to the fuse to look for a non-characteristic temperature as compared to a known temperature; (iv) monitor $i^2T$ values for the fuse; (v) monitor a number or start-ups for the fuse; (vi) monitor a number of spike currents for the fuse; (vii) monitor a power factor for the load; and (viii) determine if the fuse is properly rated for the load.

Fuse Holder with Intelligent Monitoring and Failure Mode Output Capability

Figure 2:
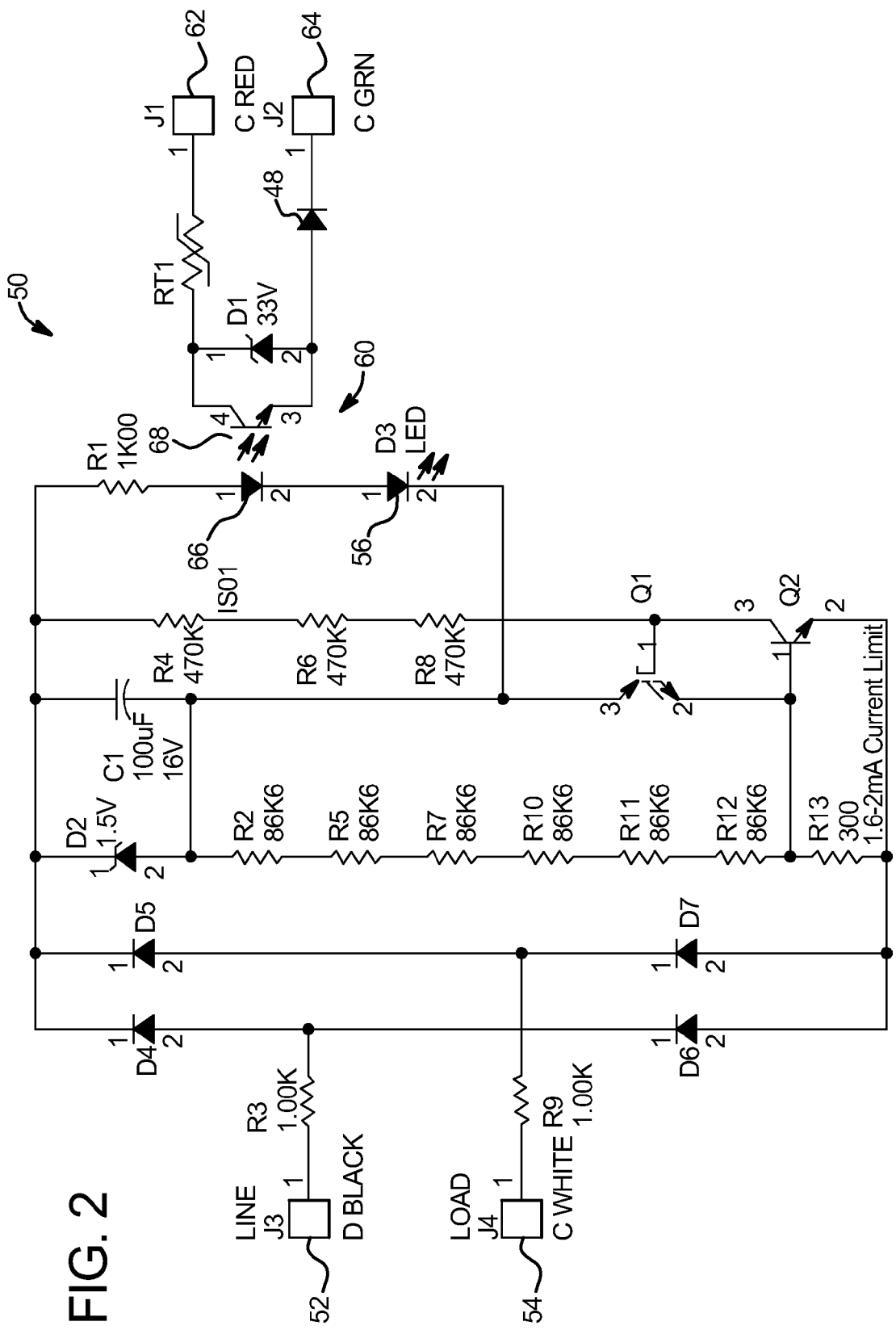
FIG. 2 is an electrical schematic illustrating one embodiment for the sensing circuitry shown in the system of FIG. 1.
Figure 3:
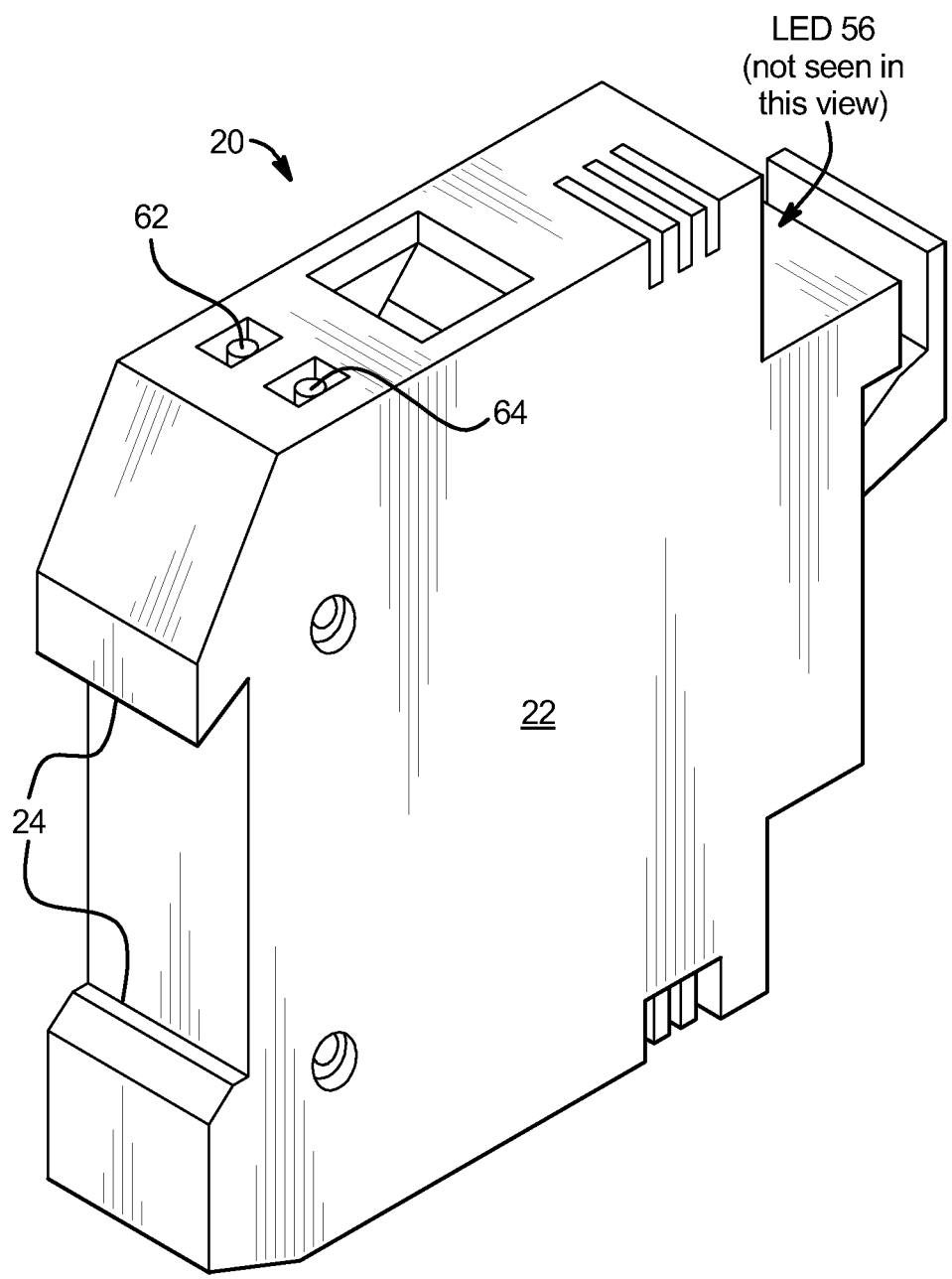
FIG. 3 is a perspective view of one embodiment of a fuse holder having integrated detection circuitry illustrated in FIGS. 1 and 2.

Referring now to FIG. 2, an embodiment of sensing circuit 50, for use with system 10 is shown. Sensing circuitry 50 is provided in a fuse holder housing shown in FIG. 3 in one embodiment. Circuitry 50 includes a line connection 52 and a load connection 54, which are placed across circuit protection device 12 as shown above in FIG. 1. Sensing circuitry 50 includes plural resistors, such as resistors R1 to R13, which in general provide. Circuitry 50 further includes plural diodes D1 to D7, which provide capacitor C1. Optically isolated output 60 includes an isolating diode 66, which optically operates switch 68.

In FIG. 2, line connection 52 is connected to voltage source 14 with fuse 12 connected between contact 52 and contact 54. The load high side is connected to contact 54 and then returns to voltage source 14. With fuse 12 installed, the low fuse impedance essentially holds the detection circuitry in a powered down mode. When the fuse opens, the supply voltage is applied across contacts 52 and 54. With AC applied voltage, diodes D4, D5, D6 and D7 act as a full-wave bridge rectifier to convert the AC supply to a DC supply, which is required by sense circuit 50. Circuit 50 is configured to operate from 24 to 600 VAC or VDC in one embodiment. In the case of a DC voltage source, the diodes are not required for rectification but prevent the filter capacitor from discharging back through the supply. As with most solid state circuits, circuit 50 operates from a low voltage DC source. Since circuit 50 operates over a wide voltage range (e.g., 24 to 600), a voltage regulator is required.

The resistor network R2 to R13 is used to share the voltage dropping function in conjunction with zener diode D2, which is also used to provide a fifteen volt regulated supply with DC filtering by capacitor C1. When operating from lower voltages, the resistor network R2 to R13 drops too much voltage, preventing the circuit from working properly. Therefore, transistor Q1 is used in conjunction with transistor Q2 and resistors R4 to R8 to gradually bypass the resistor network R2 to R13 as the voltage drops from 600 volts to 24 volts. With DC voltage developed across filter capacitor C1, the LED contained within the optical isolator ISO1 (66) is turned on in addition to optional visual indicating LED D3 in conjunction with current limiting resistor R1. The light output from the ISO1 LED forward biases the NPN bipolar transistor 68 allowing current flow between contacts 62 and 64.

In the illustrated embodiment, circuit 50 is configured to sink up to 24 VDC at 25 mA, which is adequate to interface with a PLC input. When considering the cost of PLC devices, it is prudent to isolate the potential high voltage applied to sense circuit 50 to prevent damaging the PLC during a fuse open condition should a sense circuit failure occur. To protect the ISO1 output transistor 66, its emitter-collector junction is clamped by zener diode D1. Such clamping provides reverse voltage and over-voltage protection in combination with the current limiting thermal overload device RT1 having a positive temperature coefficient.

Diode 48 is placed between switch 68 and one of contacts 62 or 64. Diode 48 allows current to flow in only one direction and prevents reverse polarity damage. In this manner, no damage results when an external device is wired to or plugged into contacts 62 and 64 improperly or in the wrong direction.

Circuit 50 of FIG. 2 is capable of detecting open or missing fuse conditions. Other analog circuit designs can be created to detect and report other singularities, such as overcurrent or over-temperature. A trip condition (max temp or current) is set in one embodiment at the holder (FIG. 3), so that a switch such as the one use in circuit 50 can be used.

Referring now to FIG. 3, an embodiment of fuse holder 20 is illustrated. Fuse holder 20 includes a housing 22, which accepts a fuse, such as Class Midget & CC Fuse and houses circuitry 50 in one embodiment. The fuse can be any class fuse rated from 24 to 600 VAC/VDC. Housing 22 includes apparatus 24 that allows fuse holder 20 to be mounted removeably on a rail, such as a Deutsches Institut für Normung ("DIN") rail. Contacts 52 and 54 illustrated additionally in FIG. 2 additionally are part of fuse holder 20 and connect to the line and load conductors of a powered and fuse protected load or electrical device. Contacts 62 and 64 shown in FIG. 2 are located on top of housing 22 as seen in FIG. 3. LED 56 is located on the backside of housing 22 from the view of FIG. 3.

One advantage of circuitry 50 and any devices such as fuse holder 20 housing circuitry 50 is that circuitry 50 does not require an external power source. That is, circuitry 50 is configured to operate off of the leakage current that flows through the circuitry when a fuse (or other circuit protection device) held by holder 20 opens. Underwriters Laboratories ("UL") standards specify that the allowable leakage current through a fuse holder is five mA or less for most applications. Circuitry 50 is configured accordingly to run or five mA or less. The impedance and resistance of circuit 50 ensures that the current is maintained below this limit. It should be appreciated that the impedance and resistance of circuitry 50 also allows the circuitry to be powered via the load power prior to opening the fuse. Here too, circuitry 50 does not require external power.

It is envisioned that one application for fuse holder 20 having circuitry 50 of FIG. 2 is with solar power panels. Solar power panels are susceptible to varying levels of energy input/output due to weather conditions. Thus when a panel generates less energy, it is ambiguous as to whether the lesser energy is due to an adverse weather condition or a faulty solar cell. The fuse holder of the present disclosure can send a signal to a controller or operator when one of the cells opens a corresponding fuse, so that the fuse can be replaced and the cell repaired if needed.

Circuit Protection Monitoring System having Data Transfer Capability

Figure 4:
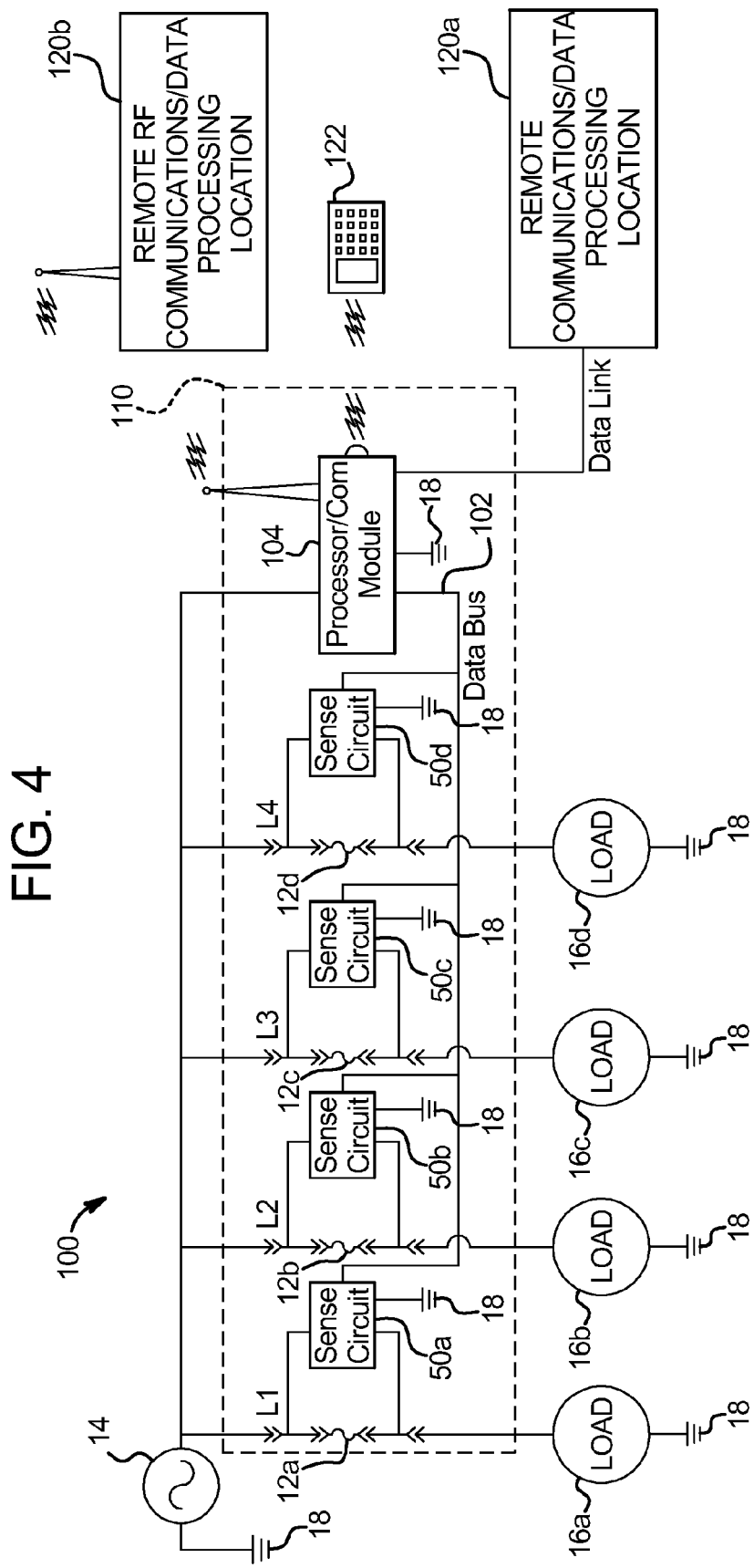
FIG. 4 is a schematic illustrating one example of multiple sensing circuits chained together.

System 10 in one embodiment is relatively simple, and includes a discrete circuit closure. Referring now to FIG. 4, however, system 100 illustrates one embodiment of an intelligent circuit monitoring system, which is modular in structure and can communicate information to remote locations for monitoring and analysis. System 100 can send streams of digital data using sensing circuitry and a communications bus. System 100 includes a power supply 14, which can be anywhere within the range described above for power supply 14 of system 10. Power supply 14 powers multiple loads 16*a* to 16*d*, each of which are referenced to ground 18 (FIG. 4 simplified by showing all loads 16*a* to 16*d* with common ground 18, however, different loads, e.g., different legs of a three-phase device, can be referenced to a different ground. Processing module 104 is likewise referenced to common ground 18. Power supply 14 is also referenced to group 18 or a different ground. Although four loads and four corresponding sensing circuits 50*a* to 50*d* are illustrated, modular system 100 can daisy chain or link any suitable number of loads.

Each load 16 (referring collectively to loads 16*a* to 16*d*) is protected by a discrete circuit protection device 12 (referring collectively to circuit protection devices 12*a* to 12*d*), such as fuses 12. A sensing circuit 50*a* to 50*d* is placed across each fuse 12*a* to 12*d*, respectfully. Each sensing circuit 50 (referring collectively to devices 50*a* to 50*d*) is referenced to ground 18. The grounding of sensing circuit 50 is dependent on the complexity of the sensing circuit. In FIG. 1 for example, sensing circuit 50 is not referenced to ground. In FIG. 4, sensing circuit 50 shares source 14 and common ground 18. In a further alternative embodiment, a separate power source is regulated off of source 14 to power circuit 50, which can have its own a separate ground.

Sensing circuits 50 in module system 100 output to a data bus 102, which feeds to a processing module 104. In the illustrated embodiment, circuit protection devices 12, sensing circuits 50, data bus 102 and processing module 104 are provided within a standalone unit 110. Each sensing circuit 50*a* to 50*d* outputting to processing module 104 has a specific address, such that processing module 104 knows which sensing circuit 50 is sending which information to module 104. Likewise, each unit 110 and processing module 104 have a discreet address relative to other units 110 having other processing modules 104. In this manner, a higher level processing location (described below) can know which processing unit 104 and corresponding stand alone intelligent unit 110 is sending which information.

Sensing circuits 50 in system 100 output data, such as digital information to processing module 104 (as opposed to the relay output to PLC 70 of circuit 50 of system 10 in FIG. 1). For example, sensing circuits can send data to processing unit 104 characterizing the start-up current of a fuse (e.g., multiple data points showing quick ramp-up in current to a peak current draw, after which current tapers to a constant level). The digital data characterizing the continuous fuse current draw is similar in nature to the digitizing of an audio signal.

Any of the different sensing scenarios for sensing circuit 50 described above for System 10 is available for each of sensing circuits 50*a* to 50*d*. Sensing circuitry 50 and PLC 70 are further configured to perform at least one of: wherein the processor is programmed to control one of the sensing circuits to perform at least one of: (i) monitor a start-up of at least one of the loads to look for non-characteristic power draws as compared to at least one known start-up curve for the first and second loads; (ii) monitor at least one of the loads under normal operation to look for non-characteristic power draws as compared to known power draws for the first and second loads during normal operation; (iii) monitor temperatures of connections of the loads to the first and second fuses to look for non-characteristic temperatures as compared to at least one known temperature; (iv) monitor $i^2T$ values for the fuses; (v) monitor a number or start-ups for the circuit protection devices or fuses; (vi) monitor a number of spike currents for the fuses; (vii) monitor a power factor for the loads; and (viii) determine if the fuses are properly rated for the first and second loads.

Additionally, it is contemplated for any of sensing circuits 50*a* to 50*d* to output real time, digital data to processing module 104, which includes one or more processor and memory that can monitor any of current, voltage and temperature to detect any of the above power anomalies in real time as opposed to discrete anomalies of system 10 of FIG. 1. Sense circuits 50*a* to 50*d* can convert analog data to digital data, which is sent via a suitable protocol to processing module 104.

As discussed, circuit 100 can be used to detect a plurality of conditions, in which analog information is converted to a digital format and sent via a network connection or data bus 102 to a central processing unit 104 that has been programmed with various trigger points. In another example application central processing unit 104 can be programmed for sense circuit 50*a* to signal when a circuit temperature reaches 150 degrees C., and/or when a peak current of 100 amps is exceeded. Circuits 50*c*, 50*d* and 50*e* can all be programmed having different temperature and/or peak current trip points. In addition, circuits 50*a* to 50*d* can be programmed with different start-up characteristic amperage curves for each sensing unit at the central processing unit. When any of the curves is exceeded by a defined percentage, some form of notification is initiated.

Processing module 104 communicates via a local area network ("LAN"), wide area network ("WAN") via an internet, RS-232 link, Ethernet or internet wired connection to a remote, wired communicative/data processing location 120*a*. Alternatively, processing module 104 communicates via a suitable wireless technology, such as Bluetooth™, WiFi™, or Zigbee™ or other suitable protocol to a wireless remote, e.g., radio frequency ("RF") communications/data processing location 120*b*. Processing unit 104 further alternatively communicate with a local hand-held interrogation device 122, which operates via infrared data association ("IRDA") or wireless protocol. Remote processing locations 120 (referring collectively to locations 120*a* and 120*b*) can be located in a same facility as unit 110, in a hub of a plurality of facilities for a particular company or manufacturing base, or via any place that can access an internet or other WAN. It is contemplated that the WAN can reach to one or more central power monitoring station 120 that monitors many loads 16 and that is responsible for communicating to a particular local facility having unit 110 when a load 16 needs to be replaced or a particular circuit protection device 12 needs to be replaced.

The processing duties of system 100 can be performed primarily at processing module 104, primarily at remote processing locations 120, or be split as desired between local and central processing stations. For example, it is contemplated that local processing modules 104 monitor such things as normal operating loads, startup loads, number of times that a circuit protection device has to endure either of such loads, phase information and the like. The local processing module 104 outputs data relating to the sensing of such parameters to remote processing 120, which in turn is charged with creating alerts and making recommendations to the different facilities feeding into remote locations 120.

Further, alternatively, local processing module 104 could additionally output recommendations and alert information for example to local hand-held interrogation device 122, allowing an operator on the ground to make any needed corrective action. Local processing 104 here can send event data to remote processors 120 for record keeping purposes. Failures relating to loose connections, which result in higher operating temperatures or hotspots within a control panel for example can be sent to hand-held interrogator 122. Hand-held interrogator 122 alerts a maintenance person or operator at the facility that a hotspot is occurring. The information can point the operator to which circuit protection device 12 is experiencing the over-temperature condition, so that the operator can more safely fix the condition. Further, the hand-held interrogator 122 can alert the operator to a potential unsafe condition prior to the operator opening a control panel and subjecting himself or herself to potential serious harm.

Remote processing 120 in one embodiment is an energy provider, which monitors the phase and power factor of different loads within a facility to be assured that the loads are operating under a limit, which allows the energy provider to provide a reduced energy rate to the facility. Alternatively, the remote facility 120 packages such information for the energy provider and sends the packaged information to the energy provider for lower rate verification purposes.

Fuse Failure Mode Indication

Figure 5:
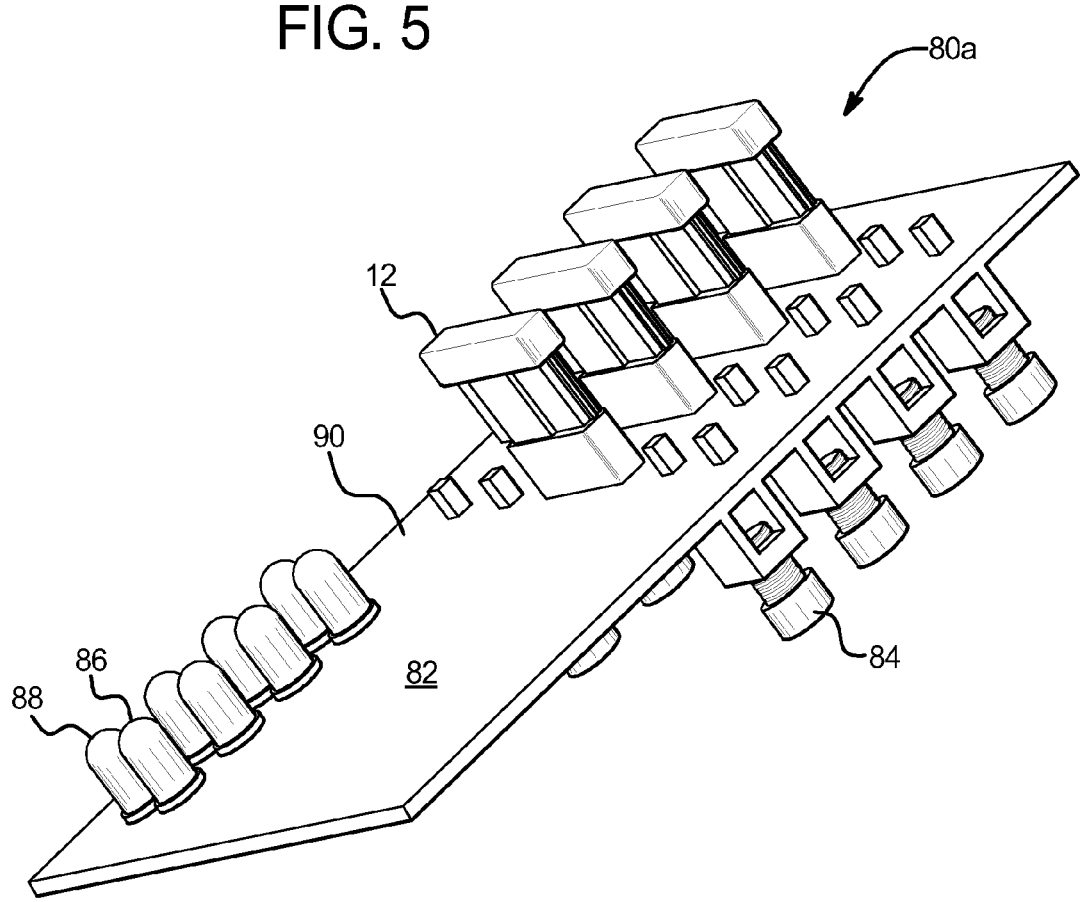
FIG. 5 illustrates one embodiment of a fuse holding panel having diagnostic information providing lights.
Figure 6:
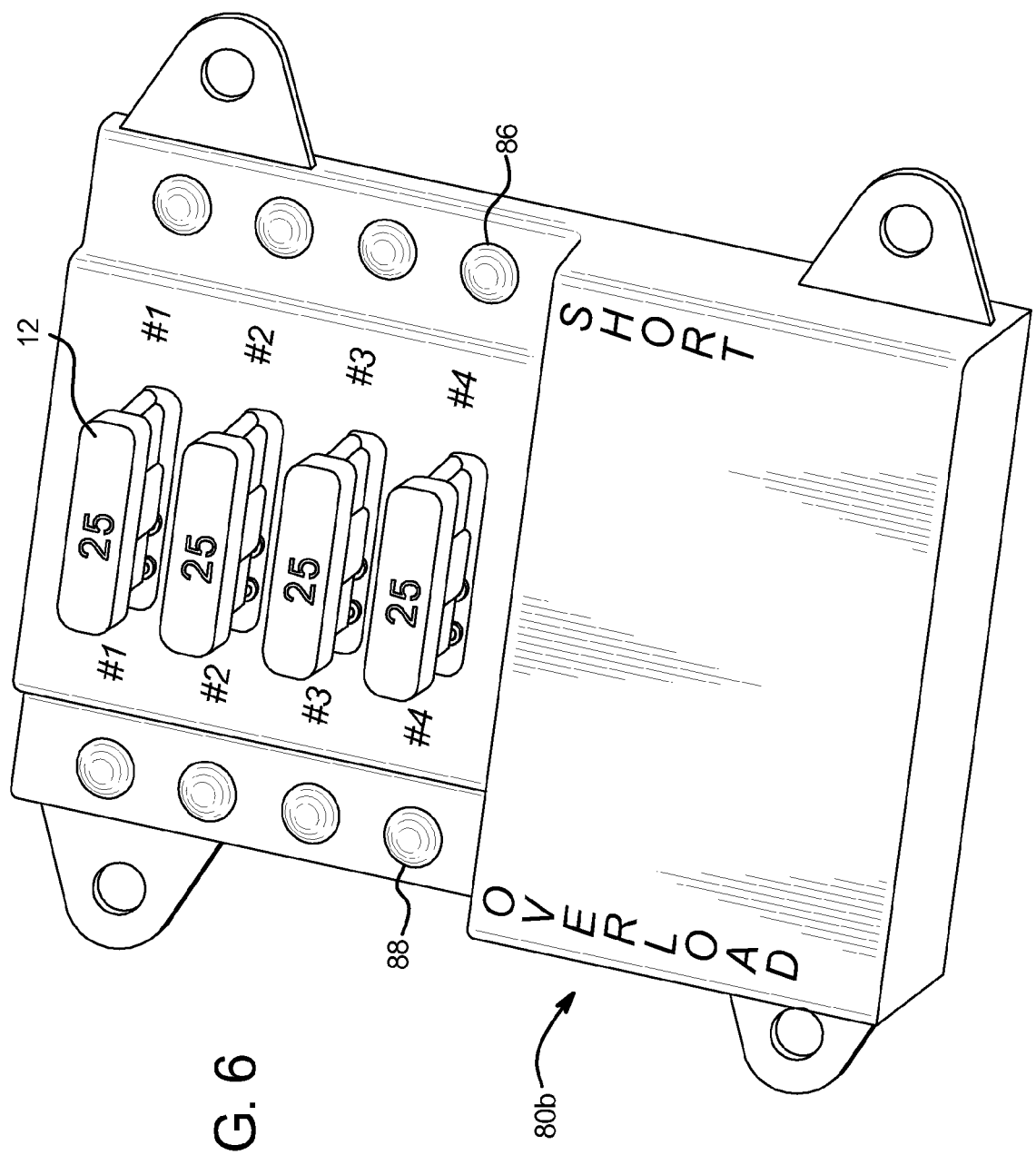
FIG. 6 is a perspective view of one embodiment for a panel layout for accepting plural fuses and providing overload and short circuit diagnostic information for each fuse.

Referring now to FIGS. 5 and 6, circuit protection systems 80*a* and 80*b* illustrate systems that provide diagnostic information to an operator at the fuse system or e.g., on a local level. In general, system 80*a* shows the inner-workings of a diagnostic system of the present disclosure, while system 80*b* shows one way to package or display the diagnostic information to the user. One suitable use for systems 80*a* and 80*b* is in connection with the landscaping industry. For landscape lighting, underwriters laboratory has revised their standards to now require individual lighting runs to be limited to a maximum of 25 amps. As a result, professional quality landscape lighting control panels now require distribution circuits that are limited individually to 25 amps. Here in particular, it is advantageous for service technicians, when troubleshooting landscaping system to have diagnostic information after one of fuses 12 opens, to know whether the failure mode is a short circuit mode or a current overload mode. Such information provides guidance to the operator to troubleshoot the source of the failure. It should be appreciated that the teachings in connection with systems 80*a* and 80*b* however are not limited to landscape lighting and can be used elsewhere, such as in automotive applications, motor-home applications or other applications in which it is advantageous to recognize a difference between an overload failure versus a short circuit failure.

It is contemplated for circuit protection device 12 to be a relatively low cost and readily available fuse 12, such as the Mini® fuse provided by the eventual assignee of the present disclosure, which is used elsewhere commonly in automobiles. Blade fuses typically include two male terminals that extend into female terminals connected electrically to traces located on a printed circuit board ("PCB") located within systems 80*a* and 80*b*. Fuses 12 can alternatively be female, such as female cartridges fuses, that mate with male terminals located on the PCB.

System 80*a* in FIG. 5 includes a PCB 82, which includes circuitry (see e.g., FIG. 8), e.g., on the underside of the PCB that can detect between a short circuit and a current-overload condition, either of which can lead to an opening of one of the fuses 12. Box lug wire connection devices 84 are also mounted to the backside of PCB 82. System 80*b* of FIG. 6 shows dedicated short circuits lamps 86 and overload lamp 88 provided on different sides of fuses 12, for ready determination period. In an alternative embodiment, a single lamp or LED is provided for each fuse 12. Here, the lamp or LED is lighted differently to indicate a short circuit failure versus a current overload failure. For example, the single lamp could be lighted continuously to indicate a short circuit and lighted intermittently to indicate a current overload fault.

System 80*b* in FIG. 6 illustrates that the above-described electronics and processing can be stored in a housing 92, having mounting apparatus 94. Housing 92 can have any NEMA or any type rating for outside or inside use non-hazardous or hazardous use. Housing 92 for example could be fastened to a lighting control panel with its front exposed for visibility of and access to fuses 12. Opening a panel at the backside exposes all of the components, fuses and lights, which are attached to a common PCB as seen in FIG. 5. The backside of the PCB displays all of the terminal connections for the distribution of power to various lighting circuit branches.

Figure 7:
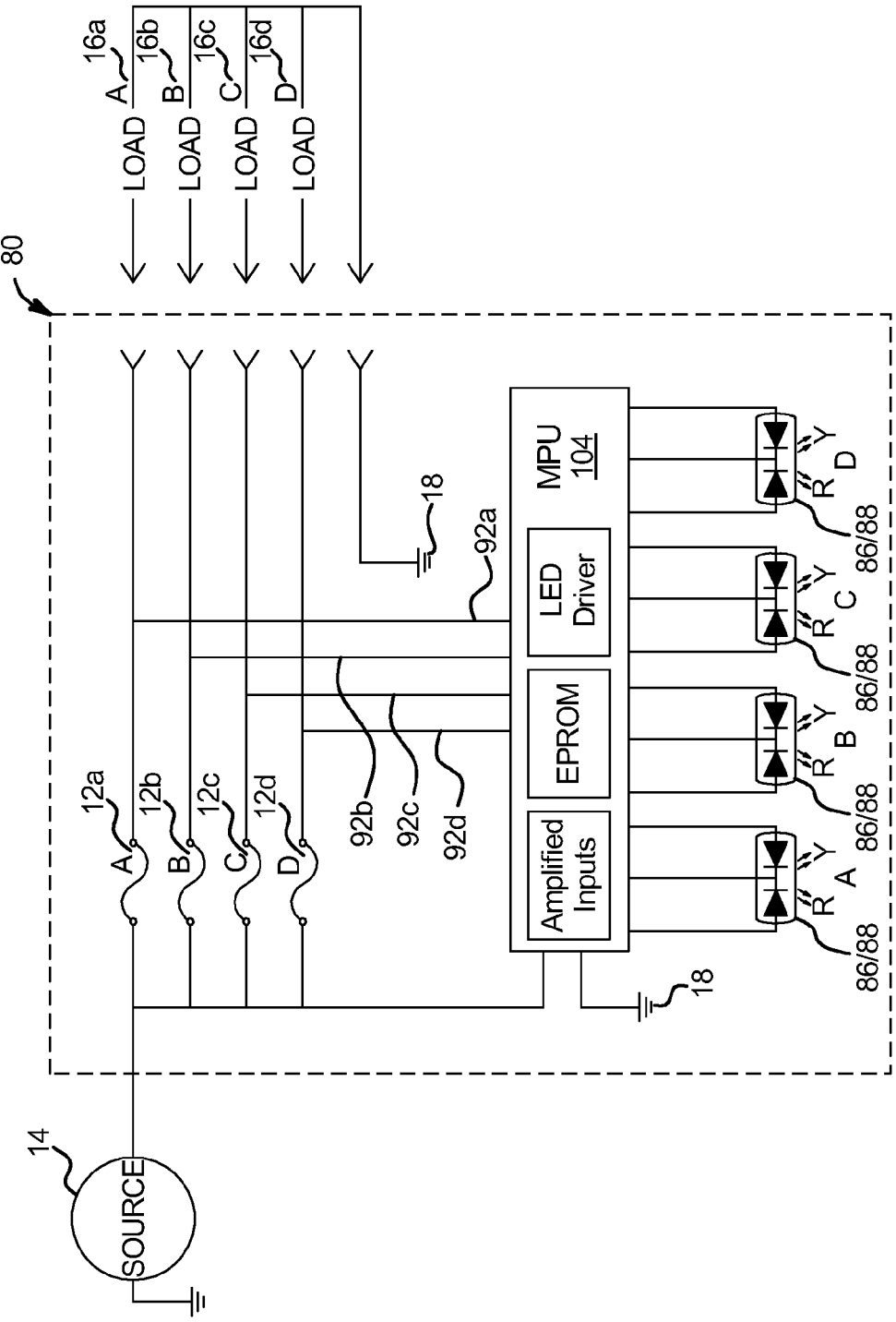
FIG. 7 is a schematic diagram illustrating one embodiment for an electrical layout of a system that visually displays different states of operation for the fuse holding panel having diagnostic information providing lights.

Referring now to FIG. 7, a high-level electrical layout for circuit protection system 80 (applicable to either system 80*a* or 80*b*) is illustrated. System 80 includes many of the components described herein, such as a voltage or power source 14, circuit protection devices (e.g., fuses) 12 (referring collectively to fuses 12*a* to 12*d*), loads 16 (referring collectively to loads 16*a* to 16*d*), ground 18, and microprocessing unit 104. Microprocessing unit 104 outputs to dual indicating lights 86/88.

Signal lines 92*c* to 92*d* carry a sensing signal for each load 16*a* to 16*d* and circuit protection device 12*a* to 12*d* to microprocessing unit 104, which is programmed to determine, for each load/protection device pair: (i) whether the pair is operating properly; (ii) excess current is being drawn (circuit protection device 12 is about to open or trip); (iii) circuit protection device 12 has opened or tripped due to a short circuit; (iv) circuit protection device 12 has opened or tripped due to a current overload; or (v) system 80 is currently not powered. System 80 can use either algorithm 150 or 170 of FIGS. 7 and 8 to make at least some of these determinations.

In one embodiment, dual indicator lights 86/88 include a red light (e.g., LED) and a yellow light (e.g., LED). Microprocessing unit 104 is programmed such that, for each load/protection device pair, the microprocessing unit causes: (i) red light/LED 86 to flash when its respective circuit protection device 12 has opened/tripped due to a short circuit; (ii) yellow light/LED 88 to flash when its respective circuit protection device 12 has opened/tripped due to current overload; (iii) red light/LED 86 to light continuously when its respective circuit protection device 12 has not yet opened but the corresponding load 16 is drawing excessive current; (iv) yellow light/LED 88 to light continuously when its respective load 16 is drawing current within limits; and (v) not light either light/LED 86 or 88 when system 80 is experiencing a failure or is not powered. System 80 using dual lights/LED's 86/88 is thus able to provide a large variety of information to the operator.

Figure 8:
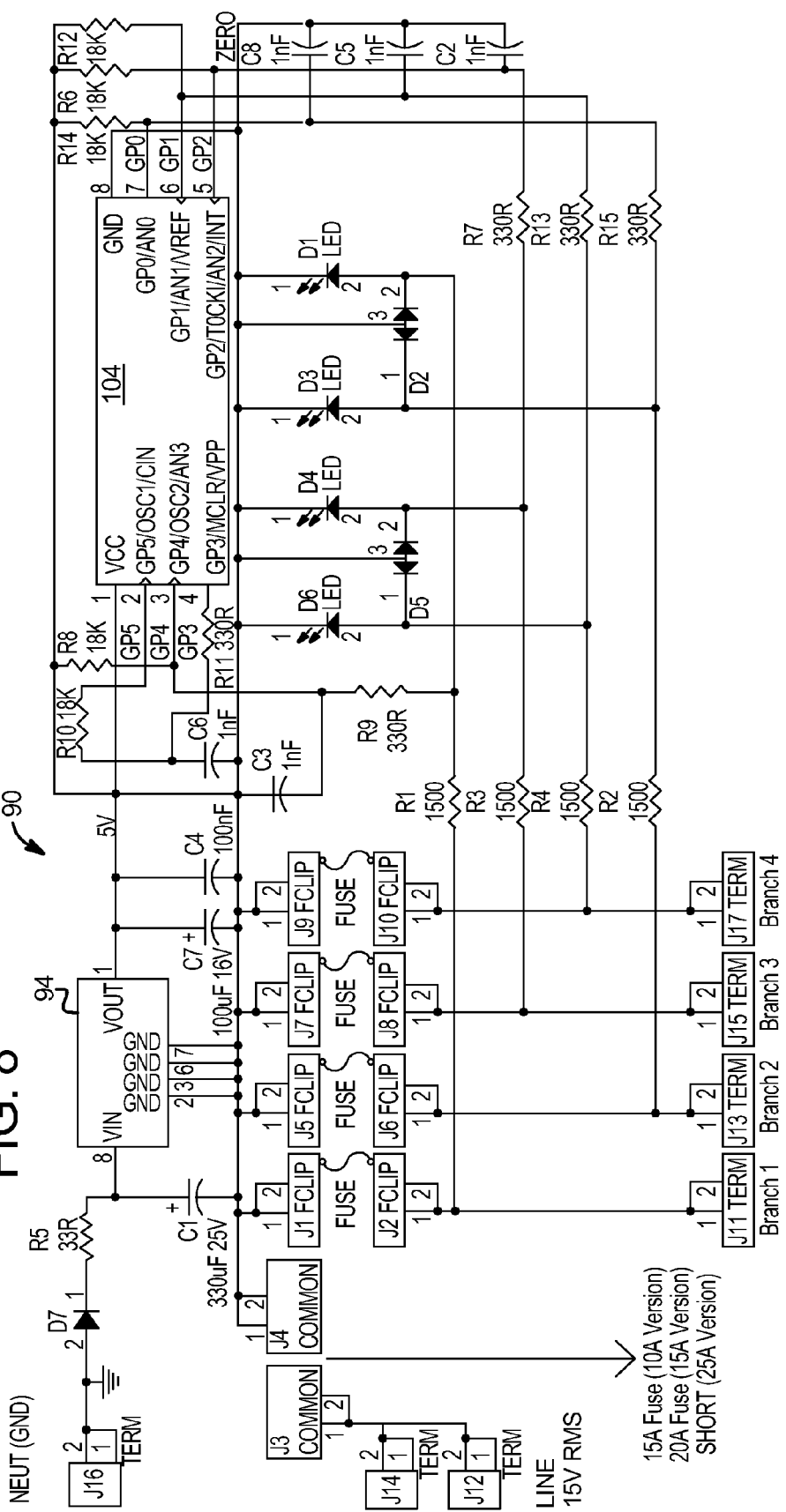
FIG. 8 is a schematic diagram illustrating one embodiment for an electrical circuit of a system that visually displays different states of operation for the fuse holding panel having diagnostic information providing lights.

Referring now to FIG. 8, circuitry 90 illustrates one suitable circuitry embodiment for circuit protection system 80 (applicable to either system 80*a* or 80*b*). Circuitry 90 includes, an e.g., four-bit microprocessor 104 that operates with multiple inputs, which can be configured under program control function as inputs for voltage detection. Processor 104 can also supply outputs for driving the indicated LED's D1, D3, D4 and D6. To provide a stable supply voltage U1, a five volt regulator 94 is provided and used with a rectifier diode D7 and a filter capacitor C1. Capacitors C7 and C4 provide additional filtering and noise suppression at the output of regulator 94. The processor operation frequency is established via resistor R10 and capacitor C6, which also determine the rate for scanning the voltage developed across four fuses (for example) installed in the fuse clips J1 through J10. Processor 104 continuously scans the fuse locations using the processor's internal ten bit A/D converter according to either algorithm discussed in connection with FIG. 9 or 10.

Using the fuse installed across J1 and J2 as an example, during scans, pin 3 of processor 104 is used to obtain fuse voltage data through resistor network R8, R9 and R1 capacitor. Capacitor C1 is used as a filter to help stabilize the measure voltage. When an open condition exists, subsequent voltage (count) data in addition to time may be used to determine failure mode. With an open condition, pin 3 of processor 104 alternates functionality between an input and output to control LED D1, while continuing to scan. In the case of a short condition, the output remains hi to forward bias the LED D1 on. If the failure mode is an overload, the output alternates between a hi and lo conditions flashing the LED at a predetermined rate. Resistor R9 is also used to limit the LED current. Resistor R9 is further used to prevent the AC voltage present at J2, during an open fuse condition, from holding the LED D1 in an on condition through resistor R1.

One-half of diode network D2 is used to limit the reverse voltage applied to LED D1 when the AC voltage at J2 becomes negative with respect to J4. When an open fuse is replaced, subsequent scans detect the voltage change causing processor 104 to turn LED D1 off. With the fuse replaced the low impedance prevents that AC voltage when it becomes positive with respect to J4 from turning on LED D1. The process is repeated for the other fuse locations.

Figure 9:
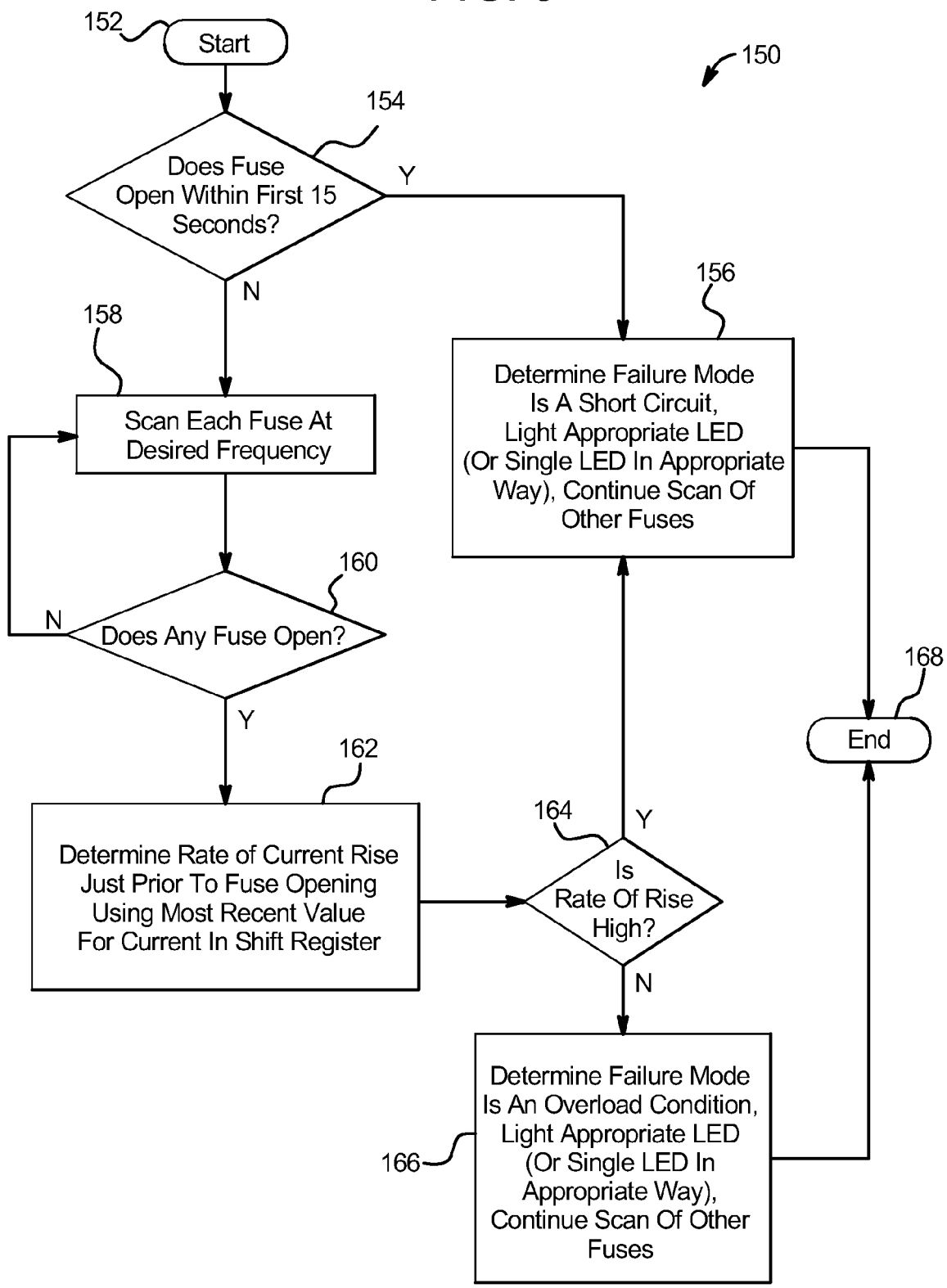
FIG. 9 is a logic flow diagram illustrating one logic sequence for determining between a short circuit and a current overload failure.

Referring now to FIG. 9, logic flow diagram 150 for either system 80a or 80b illustrates one embodiment for determining between a short circuit failure mode and a current-overload failure mode. Upon beginning algorithm 150 at oval 152, if when the circuit 90 is first energized, a fuse opens within the first fifteen seconds, as determined at diamond 154, the failure is a determined to be a short circuit as seen at block 156. Initial short circuit detection is based only on time. The fifteen second duration is based upon a determination of the maximum time that can pass before a failure must be considered as an overload. The actual transition from an overload failure to a short circuit failure is not specifically and universally defined and therefore is somewhat subjective.

Once the initial 15 seconds has past, a more complex approach is needed to indicate the difference between a short and an overload. For a specific fuse rating, the fuse resistance is known. Knowing the fuse resistance and measuring voltage drop across the fuse, current can be determined based upon Ohms law. However, circuit 90 can be used with different amperage fuses. Also, fuse resistance changes with temperature. Since the resistance of different amperage ratings varies, one system might require the user have to know what fuse is being used, to indicate accurately the condition that caused the fuse to open. To eliminate the fuse amperage rating from being a variable, rate of rise is used to determine the failure mode.

To use rate of rise processor 104 as seen at block 158, scans each fuse using a predetermined frequency. For this discussion a scan frequency of 33 KHz is assumed with, e.g., four fuses to scan, and assuming an AC supply voltage frequency of 60 Hz, approximately 134 scans will occur per fuse for each power supply period (16.7 ms). As each fuse is scanned, the peak-to-peak voltage is stored the shift register for the fuse, so that only the four most recent scans remain available for each fuse. When a fuse opens as determined at diamond 160, the low voltage normally developed across the fuse (low impedance) quickly changes to an open circuit condition (high impedance) having a corresponding significant voltage increase. When this condition is detected at diamond 160, process or 104 recognizes that a fuse has opened. The processor operating frequency is high enough to provide the needed computation time without interrupting the scanning process. Subsequent shift register values are compared and a rate of rise is determined as seen at block 162.

In the example a ten bit A/D (1024 counts) converter is used to sample the voltages. If the rate of rise based on the counts in the shift registers is lower than a set point, as determined at diamond 164 circuit 90 determines that the current has been slowly increasing and that the probability is high that the failure mode can be attributed to an overload condition as determined at block 166, and the appropriate LED is lighted (or singled LED lighted in appropriate way). If the count rate increases significantly to be above a rate set point, as determine at diamond 164, then the probability is high that the failure mode is the result of a short circuit, as determined at block 156, and the appropriate LED is lighted (or singled LED lighted in appropriate way).

Regardless of the fuse rating, a common rate of rise set point can be selected that represents the transition between an overload and a short circuit. Based upon failure mode determination the appropriate indicating LED is activated (or indicated by a certain way of lighting a single LED per fuse), while scanning of the remaining fuses continues without interruption. Method 150 then ends, as seen at oval 168. Providing this type of information to a service technician can help determine the system failure mode and reduce the time required to restore operations.

Figure 10:
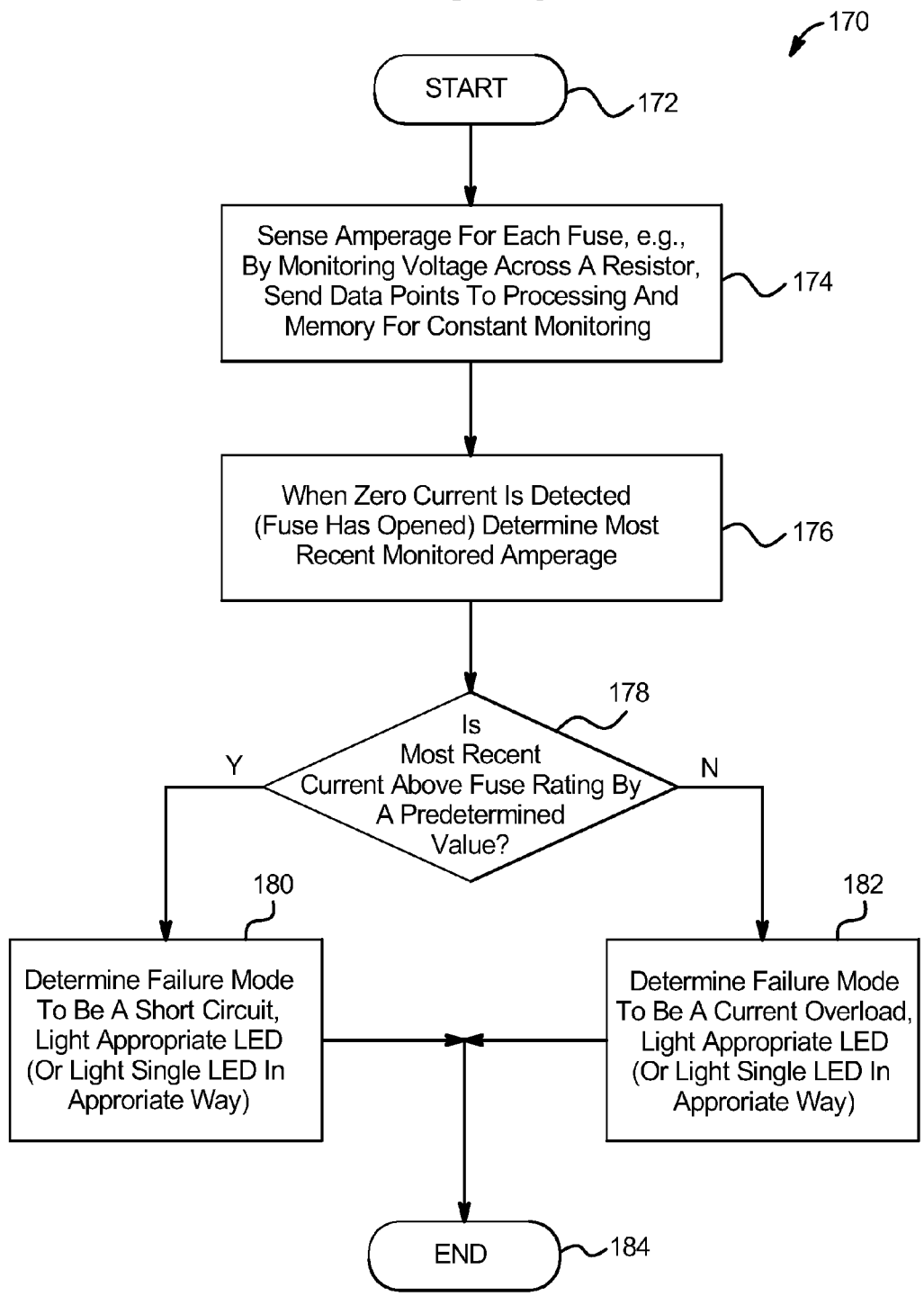
FIG. 10 is a logic flow diagram illustrating another logic sequence for determining between a short circuit and a current overload.

Referring now to FIG. 10, logic flow diagram 170 for either system 80a or 80b illustrates another embodiment for determining between a short circuit failure mode and a current-overload failure mode. In the alternative embodiment, starting at oval 172, amperage for each fuse is sensed and sent to processing and memory at block 174. Here, the rate of rise of current is not sensed, however, after fuse 12 opens and no current is detected as determined at block 176, if the last monitored value exceeds the fuse rating by a predetermined value, as determined at diamond 178, a short circuit failure mode is determined and LED 86 is lit as seen at block 180. However, if the value is below the predetermined value and is therefore closer to the fuse rating, the failure mode is determined to be an overload and LED 88 is lit accordingly as seen at step 182. Method 170 then ends as seen at oval 184.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A circuit protection method comprising:
   sensing current and voltage across a fuse protecting a load during a start-up of a load and after the start-up of the load;
   sending at least one signal indicative of the current and the voltage;
   determining that the fuse opened;

determining an elapsed time between the start up of the load and the fuse opening; and using the at least one signal and the elapsed time to determine a failure mode of the fuse.

2. The circuit protection method recited in claim 1, further comprising:
determining whether the elapsed time is less than a threshold value; and
determining that the failure mode of the fuse is a short circuit based on the determination that the elapsed time is less than the threshold value.

3. The circuit protection method of claim 2, wherein the threshold value is 15 seconds.

4. The circuit protection method recited in claim 1, further comprising:
determining whether the elapsed time is greater than a threshold value;
determining a rate of rise of the current based at least in part on the at least one signal;
determining whether the rate of rise is greater than a threshold rate; and
determining that the failure mode of the fuse is a short circuit based on the determination that the elapsed time is greater than a threshold value and the determination that the rate of rise is greater than the threshold rate.

5. The circuit protection method of claim 4, wherein the threshold value is 15 seconds.

6. The circuit protection method recited in claim 1, further comprising:
determining whether the elapsed time is greater than a threshold value;
determining a rate of rise of the current based at least in part on the at least one signal;
determining whether the rate of rise is less than a threshold rate; and
determining that the failure mode of the fuse is an overload condition based on the determination that the elapsed time is greater than the threshold value and the determination that the rate of rise is less than the threshold rate.

7. The circuit protection method of claim 6, wherein the threshold value is 15 seconds.

8. A circuit protection method comprising:
sensing current and voltage across a fuse protecting a load during a start-up of a load and after the start-up of the load;
sending at least one signal indicative of the current and the voltage;
determining that the fuse opened;
determining a current value across the fuse prior to the fuse opening based on the at least one signal;
determining an elapsed time between the start up of the load and the fuse opening; and
using the determined current value and the elapsed time to determine a failure mode of the fuse.

9. The circuit protection method recited in claim 8, further comprising:
determining whether the current value is greater than a threshold value; and
determining that the failure mode of the fuse is a short circuit based on the determination that the current value is greater than the threshold value.

10. The circuit protection method recited in claim 8, further comprising:
determining whether the current value is less than a threshold value; and
determining that the failure mode of the fuse is a current overload condition based on the determination that the current value is less than the threshold value.

* * * * *